(12) United States Patent
Huang et al.

(10) Patent No.: US 8,088,692 B2
(45) Date of Patent: Jan. 3, 2012

(54) METHOD FOR FABRICATING A MULTILAYER MICROSTRUCTURE WITH BALANCING RESIDUAL STRESS CAPABILITY

(75) Inventors: Ying-Jui Huang, Hsinchu (TW); Hwai-Pwu Chou, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 118 days.

(21) Appl. No.: 12/575,754

(22) Filed: Oct. 8, 2009

(65) Prior Publication Data

US 2011/0008962 A1    Jan. 13, 2011

(30) Foreign Application Priority Data

Jul. 10, 2009    (TW) .............................. 98123422 A

(51) Int. Cl.
*H01L 21/302* (2006.01)
*H01L 21/461* (2006.01)

(52) U.S. Cl. .................. 438/737; 438/53; 257/E21.211; 216/14

(58) Field of Classification Search ............ 438/50, 438/53, 60, 737; 257/418, 254, 417, E21.211, 257/E29.324; 73/514.38, 514.37; 216/2, 216/14

See application file for complete search history.

(56) References Cited

U.S. PATENT DOCUMENTS

| | | | |
|---|---|---|---|
| 2006/0220160 A1* | 10/2006 | Miles .......................... | 257/415 |
| 2008/0218840 A1* | 9/2008 | Qui et al. ...................... | 359/276 |
| 2010/0084723 A1* | 4/2010 | Chen et al. ................... | 257/416 |
| 2010/0317138 A1* | 12/2010 | Lan et al. ....................... | 438/52 |

OTHER PUBLICATIONS

Huang et al., "Study of symmetric microstructures for CMOS multilayer residual stress," Sensors and Actuators A:Physical, 2009.

* cited by examiner

*Primary Examiner* — Caridad Everhart
(74) *Attorney, Agent, or Firm* — Muncy, Geissler, Olds & Lowe, PLLC

(57) ABSTRACT

A method for fabricating a multilayer microstructure with balancing residual stress capability includes forming a multilayer microstructure on a silicon substrate and conducting a step of isotropic plasma etching. The multilayer microstructure includes a first metal layer and a second metal layer patterned and aligned symmetrically to form etching through holes; a metal via layer surrounding each etching through hole; and an insulating layer filling each etching through hole and disposed between the substrate and the first metal layer. The step of isotropic chemical plasma etching removes the insulating layer in each etching through hole, the insulating layer between the substrate and the metal layer and a portion of the substrate to form a suspended multilayer microstructure on the substrate, during which a chamber pressure larger than vacuum and maintains a ratio between a lateral etching rate and a vertical etching rate between 0.5 to 1 is used; and the reaction gases comprise a gaseous fluoride and oxygen.

8 Claims, 6 Drawing Sheets

METHOD FOR FABRICATING A MULTILAYER MICROSTRUCTURE WITH BALANCING RESIDUAL STRESS CAPABILITY

BACKGROUND OF THE INVENTION

1. Field of the Invention

The present invention relates to a method for fabricating a multilayer microstructure, more particularly to a method for fabricating a multilayer microstructure with balancing residual stress capability.

2. Description of the Related Art

Recently, the fabrication of microelectromechanical systems (MEMS) devices such as pressure sensors, microphones, gas detectors, accelerometers, resonators, micro mirrors and bio-sensors and so on, has developed to exploit mature fabrication processes of semiconductor industry such as the complementary metal oxide semiconductor (CMOS) process. Therefore, the microstructure of a MEMS device may be fabricated together with the integrated circuits of the MEMS device with a single CMOS process to lower the cost. Silicon, polysilicon, interconnects and via layers, etc. commonly used in the CMOS process can be used to form the microstructure of a CMOS-MEMS device.

Then in a post-CMOS process, an etching step is conducted to form a suspended microstructure on the substrate. The etching step may use wet etching or dry etching. The etching rate and the selectivity of the wet etching are better, but the resulted surface tension from the etching solution on the microstructure and the substrate may causes stiction between them. As a result, dry etching is used to avoid stiction. Existing dry etching methods are sputter etching, reactive ion etching (RIE) and plasma etching. Sputter etching uses ion milling to remove the etchant, and is therefore classified as physical etching, which is anisotropic and has low selectivity with respect to the etchant. Plasma etching engages a chemical reaction between the reaction gas and the etchant, and is therefore classified as chemical etching, which is isotropic and has high selectivity with respect to the etchant. Reactive ion etching engages a chemical reaction between the reaction gas and the etchant, and uses ion milling to remove the product of the chemical reaction. It is therefore classified to be between sputter etching and plasma etching, and is anisotropic and has high selectivity with respect to the etchant. The prior art post-CMOS process typically uses RIE in order to form microstructures of high aspect ratio.

FIG. 1a, FIG. 1b and FIG. 1c are the cross-sectional diagrams illustrating the flow of a prior art fabrication method for a CMOS-MEMS device 100. Through the CMOS process, a CMOS circuit 120 and a multilayer structure 130 are formed in a substrate 110 as shown in FIG. 1a. The multilayer structure 130 includes inter-stacked dielectric layers 111 and patterned metal layers 131. The patterned metal layers 131 are aligned to form etching through holes 132. The metal layers 131 are formed with Metal 1, Metal 2, Metal 3 and Metal 4, which are originally used as interconnects. The material of the substrate 110 and the dielectric layers 111 respectively includes silicon and silicon dioxide, primarily. In the post-CMOS process as illustrated in FIG. 1b, the dielectric layers 111 is etched by using anisotropic RIE until the substrate 110 is exposed, wherein the metal layer 131 is used as the mask for anisotropic RIE, and trifluoromethane and oxygen are used as reaction gases for anisotropic RIE. Next, as illustrated in FIG. 1c, the substrate 110 is etched by using isotropic RIE in order to form a suspended multilayer microstructure 130', wherein sulfur hexafluoride ($SF_6$) and oxygen are used as reaction gases for isotropic RIE.

Referring to FIG. 1c, since the coefficient of thermal expansion of the metal layers 131 and the dielectric layer 111 interposed between every two of the metal layers 131 are different, residual stress may be resulted between any of the metal layers 131 and its adjacent dielectric layer 111. When a dielectric layer exists between symmetrical upper and lower metal layers, the residual stress between the upper metal layer and the dielectric layer, and between the lower metal layer and the dielectric layer can cancel each other out; otherwise, the residual stress is not balanced and may deform the structure. The bottom-most dielectric layer 111, is covered by the metal layers 131 as illustrated in FIG. 1c, and is not able to be removed by anisotropic RIE, and therefore, the suspended multilayer microstructure 130' formed on the substrate 110 is not symmetrical, which results in the residual stress causing severe curl-up of the microstructure as shown in FIG. 2. Such deformation affects not only the mechanical property of the MEMS device, but also its electrical properties.

In order to solve aforementioned problems, the present invention discloses a method for fabricating a multilayer microstructure with balancing residual stress capability so that the residual stress is balanced and the flatness of the MEMS device is maintained.

SUMMARY OF THE INVENTION

The present invention is directed to a method for fabricating a multilayer microstructure with balancing residual stress capability, which forms a suspended multilayer microstructure symmetrical in the vertical direction, so that the residual stress is balanced and the flatness of the MEMS device is maintained.

According to one embodiment, a method for fabricating a multilayer microstructure with balancing residual stress capability includes the following steps. First, forming a multilayer microstructure on a substrate, wherein the material of the substrate comprises silicon. The multilayer microstructure includes a first metal layer, a metal via layer, a second metal layer and an insulating layer, wherein the first metal layer and the second metal layer are patterned and aligned symmetrically to form a plurality of etching through holes; and the metal via layer is disposed between the first metal layer and the second metal layer to surround each of the etching through hole; the insulating layer fills each etching through hole and the remaining space between the first metal layer and the second metal layer, and is also disposed on the substrate for the first metal layer to stack thereon. Next, a step of isotropic chemical plasma etching is conducted, wherein the metal layers and the metal via layer are used as the mask for removing the insulating layer filling the etching through holes, the insulating layer between the first metal layer and the substrate and a portion of the substrate, so as to form a suspended multilayer microstructure on the substrate, wherein in the step of isotropic chemical plasma etching, a chamber pressure larger than vacuum is used. and a ratio between a lateral etching rate and a vertical etching rate under the chamber pressure is between 0.5 to 1; and the reaction gases comprise a gaseous fluoride and oxygen. Such suspended multilayer microstructure is structurally symmetrical in the vertical direction; therefore, the residual stress can be balanced to effectively improve the curl-up problem.

According to one embodiment, a chamber pressure of lower degree of vacuum is used to achieve isotropic chemical plasma etching, and the ratio of the reaction gases is adjusted to improve the etching rate.

DETAILED DESCRIPTION OF THE INVENTION

The objectives, technical contents and characteristics of the present invention can be more fully understood by reading the following detailed description of the preferred embodiments, with reference made to the accompanying drawings.

Figure 1A:
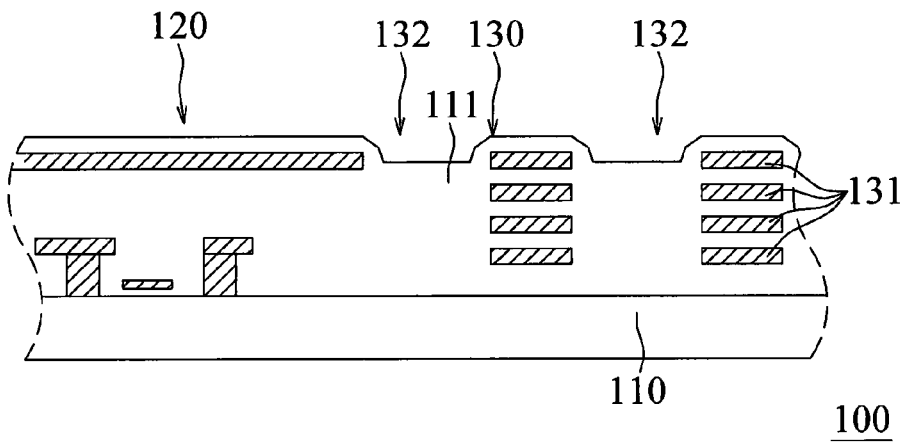
FIG. 1a, FIG. 1b and FIG. 1c are cross-sectional diagrams illustrating the flow of a prior art method for fabricating a nonsymmetrical multilayer microstructure.
Figure 1B:
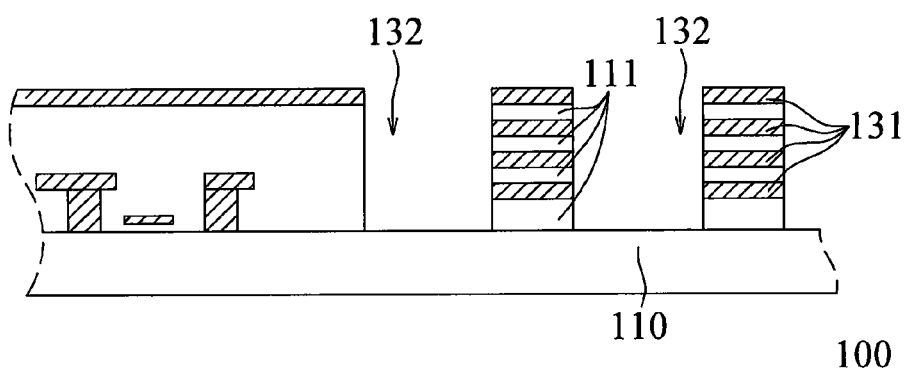
Figure 1C:
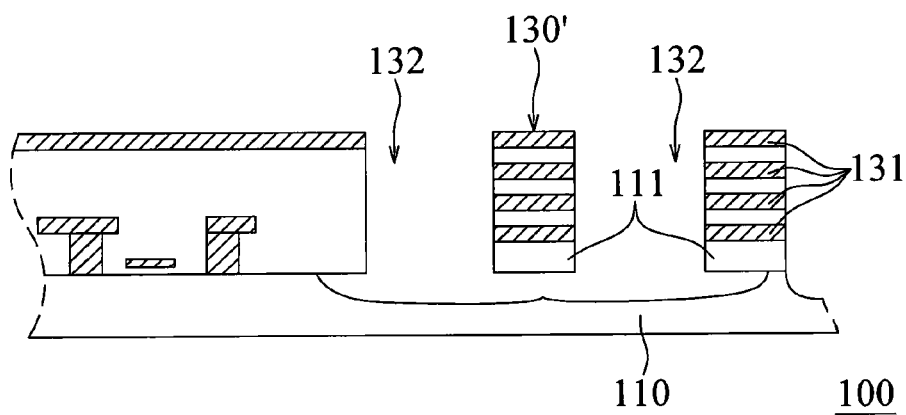
Figure 2:
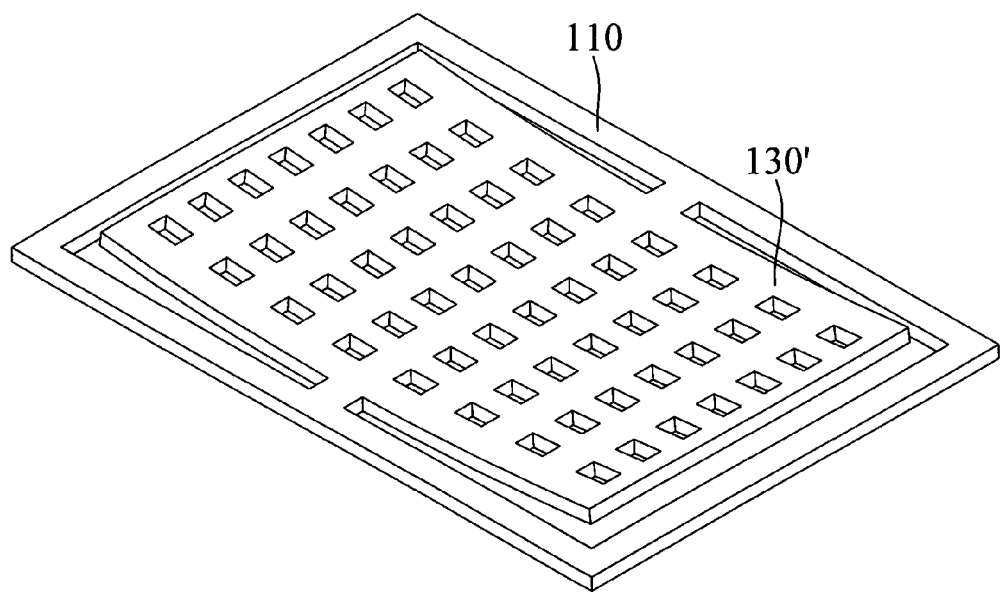
FIG. 2 is a schematic diagram illustrating the curl-up problem caused by the residual stress in a MEMS device.
Figure 3A:
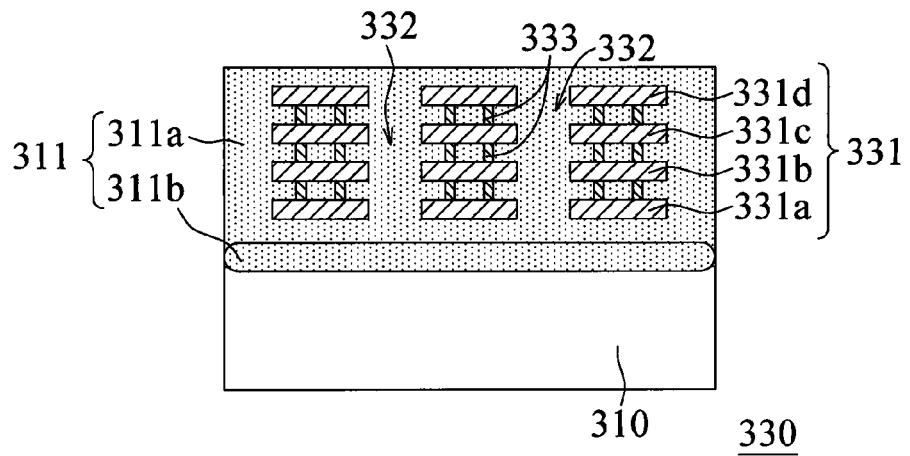
FIG. 3a, FIG. 3b and FIG. 3c are cross-sectional diagrams illustrating the flow of the method for fabricating a multilayer microstructure according to an embodiment.
Figure 3B:
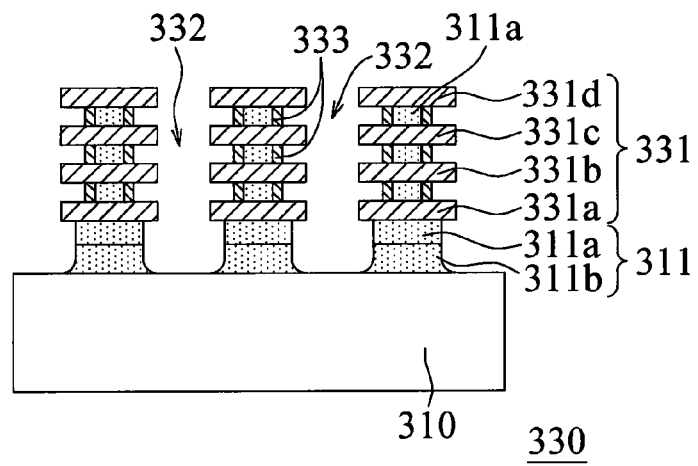
Figure 3C:
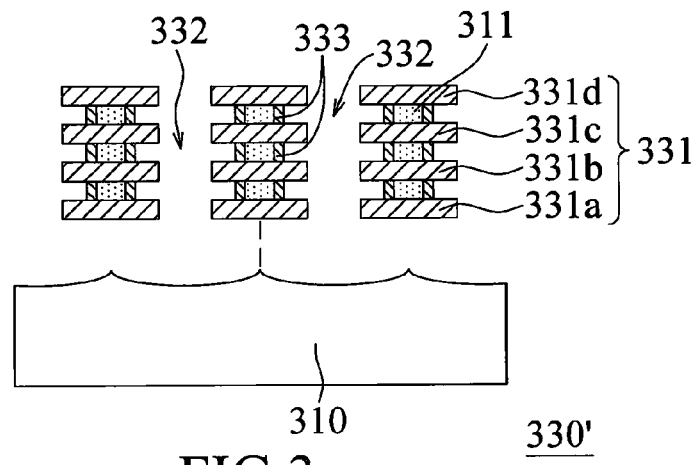
Figure 4:
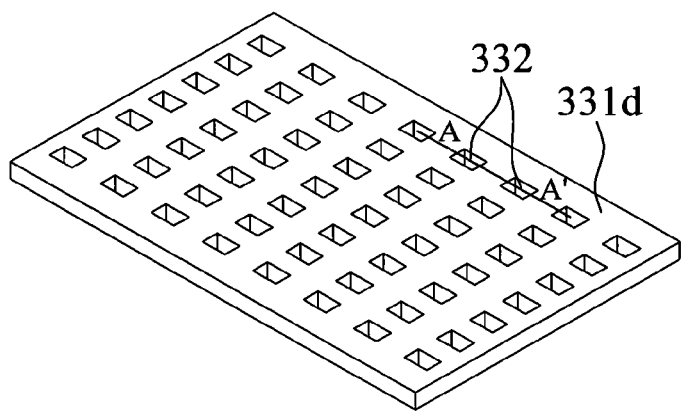
FIG. 4 is a schematic diagram illustrating the side-view of a layer of the multilayer microstructure according to an embodiment.
Figure 5A:
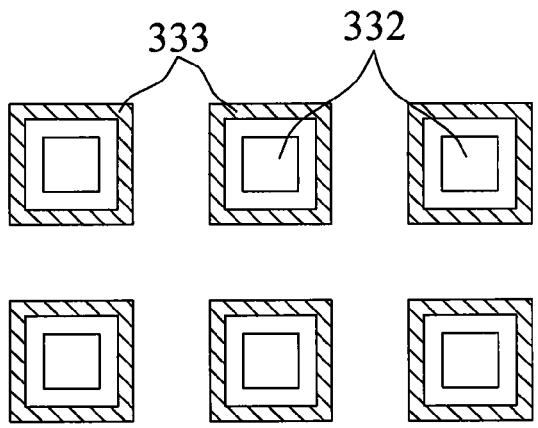
FIG. 5a and FIG. 5b are schematic diagrams illustrating the perspective-view of the multilayer microstructure according to two embodiments.
Figure 5B:
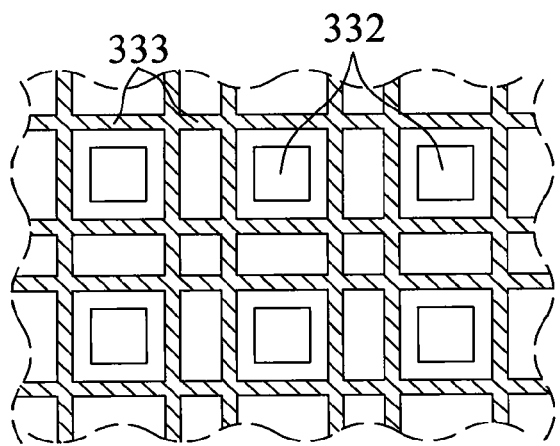

FIG. 3a, FIG. 3b and FIG. 3c are cross-sectional diagrams illustrating the flow of a method for fabricating a multilayer microstructure according to one embodiment, which includes the following steps. Referring to FIG. 3a, a multilayer microstructure 330 is formed on a substrate 310. According to an embodiment, the multilayer microstructure 330 includes a plurality of metal layers 331, metal via layers 333 and insulating layers 311. FIG. 4 is a schematic diagram illustrating a side-view of the top-most layer of the multilayer microstructure and FIG. 3a is a diagram illustrating the cross-sectional view taken along line AA'. As shown in FIG. 3a and FIG. 4, the plurality of metal layers 311 includes a first metal layer 331a, a second metal layers 331b, a third metal layer 331c and a fourth metal layer 331d, all of which are patterned and aligned symmetrically to form a plurality of etching through holes 332 through each metal layer 331a, 331b, 331c, or 331d. FIG. 5a and FIG. 5b are schematic diagrams illustrating a perspective-view of the multilayer microstructure according to two embodiments. The metal via layer 333 is disposed between the metal layers 331a and 331b, 331b and 331c, 331c and 331d to surround each etching through hole 332. As illustrated in FIG. 3a, the insulating layer 311 fills the etching through holes 332, the remaining space between the metal layers 331a, 331b, 331c and 331d, and is disposed on the substrate 310 so that the first metal layer 331a can stack thereon.

Referring to FIG. 3a, according to one embodiment, the multilayer microstructure 330 is fabricated by a CMOS process, wherein the metal layers 331a, 331b, 331c, and 331d are respectively Metal 1, Metal 2, Metal 3 and Metal 4 for interconnects; the metal via layer 333 is the via layer for interconnects; the insulating layer 311 includes the dielectric layer 311a, interposed between the metal layers 331, originally used to separate interconnects, and the field oxide layer 311b, disposed on the substrate, originally used to separate CMOS transistors. In addition, according to one embodiment, the insulating layer 311 and the substrate 310 are respectively made of silicon dioxide ($SiO_2$) and silicon (Si).

Next, a step of isotropic chemical plasma etching is conducted. As illustrated in FIG. 3b, the top-most metal layer 331d and the metal via layer 333 are used as the mask for removing the portion of the insulating layer 311 in the etching through holes 332, while retaining the portion of the insulating layer 311 interposed between the metal layers 331a, 331b, 331c and 331d so that the inter-stacking of the microstructure is maintained.

Then the step of isotropic chemical plasma etching is performed to remove completely the insulating layer 311 between the first metal layer 331a and the substrate 310 so as to form a suspended multilayer microstructure 330', wherein all of the insulating layer 311 is between symmetrical metal layers 331 so that the residual stress between the upper metal layer and the insulating layer, and the residual stress between the lower metal layer and the insulating layer are balanced. The symmetrical multilayer microstructure may be formed with at least two metal layers, then three metal layers and so forth.

Figure 6:
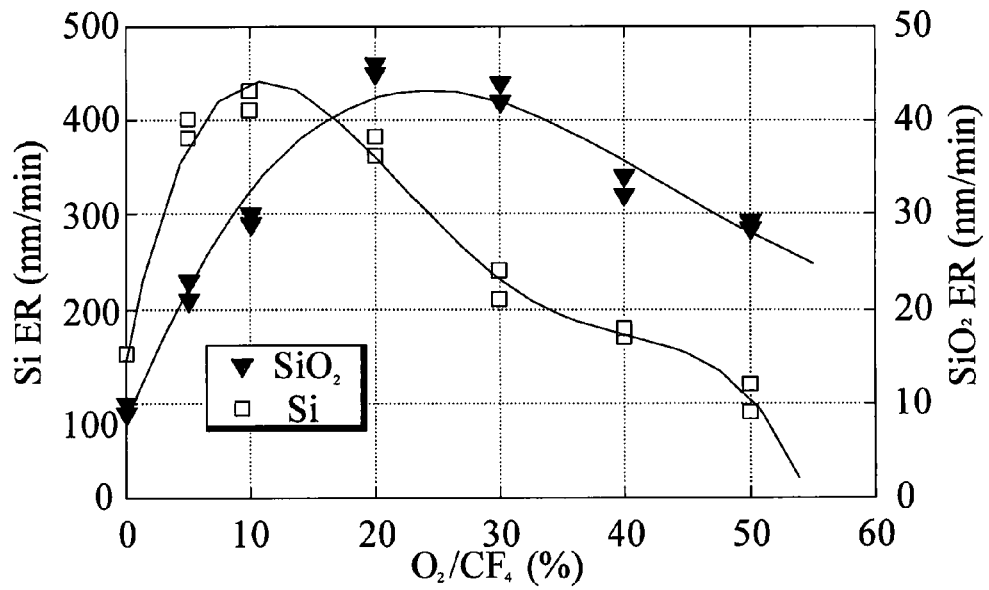
FIG. 6 is a diagram illustrating the relation between the ratio of the reaction gases and the etching rate.

According to the foregoing embodiments, the materials to be etched are $SiO_2$ and Si. Hence, the step of isotropic chemical plasma etching uses a gaseous fluoride and oxygen as reaction gases. Fluorocarbons such as tetrafluoromethane and hexafluoroethane may be used as the gaseous fluoride to provide neutral fluorine atoms and free fluorine radicals. By adding a small amount of $O_2$, the carbon atom is combined with the oxygen atom and neutral fluorine atoms and free fluorine radicals are released so that the etching rate is effectively increased. However, if the concentration of oxygen is too high, a substantial amount of surface to be etched may be covered with oxygen, causing the etching rate to drop. For the convenience of illustration how the gas ratio is determined, $CF_4$ and $O_2$ are assumed to be the reaction gases according to one embodiment. It is emphatically noted that the reaction gases can be but not limited to $CF_4$ and $O_2$. FIG. 6 is a diagram illustrating the relation between the gas ratio ($O_2$:$CF_4$) and the etching rate (ER), wherein the etching rate of Si is marked by a square legend, and corresponds to the scale on the left; the $SiO_2$ etching rate is marked by a triangular legend, and corresponds to the scale on the right. As illustrated in FIG. 6, when the percentage of $O_2$ in $CF_4$ is between 10%~40%, the etching rate of $SiO_2$ is higher than other percentages outside the range, and the etching rate peaks at when the percentage is about 23%. On the other hand, when the percentage of $O_2$ in $CF_4$ is between 5%-10%, the etching rate of Si is higher than other percentages outside the range, and the etching rate peaks at when the percentage is about 10%. If the selectivity of etching Si over $SiO_2$ is concerned, the percentage of $O_2$ in $CF_4$ is preferably around 5%, which provides higher etching rate of Si and $SiO_2$.

Figure 7:
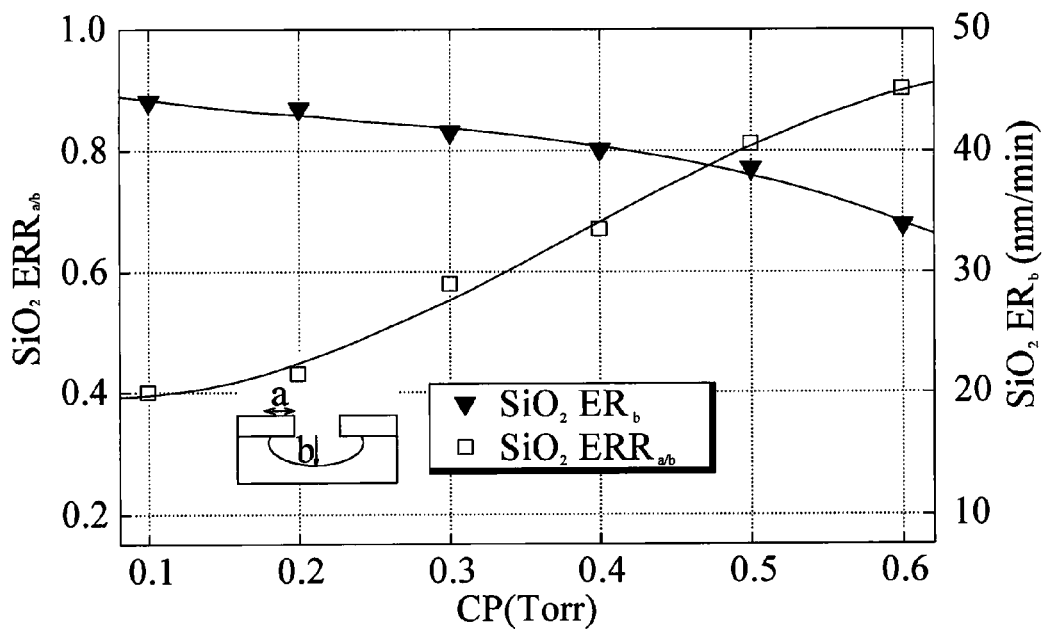
FIG. 7 is a diagram illustrating the relation between the chamber pressure and the etching rate ratio and between the chamber pressure and the vertical etching rate.

The step of isotropic chemical plasma etching achieves isotropic etching by adjusting the chamber pressure according to one embodiment. Isotropic etching refers to substantially the same lateral etching rate ($ER_a$) and the vertical etching rate ($ER_b$); in other words, the etching rate ratio$_{a/b}$ ($ERR_{a/b}$) is substantially close to 1, where the etching rate ratio ($ERR_{a/b}$) is defined as the ratio between the lateral etching rate ($ER_a$) and the vertical etching rate ($ER_b$). FIG. 7 is a diagram illustrating the relation between the chamber pressure (CP) and the etching rate ratio ($ERR_{a/b}$) and the relation between the chamber pressure (CP) and the vertical etching rate ($ER_b$). The etching rate ratio ($ERR_{a/b}$) is marked by a square legend and corresponds to the scale on the left, and the vertical etching rate ($ER_b$) is marked by a triangular legend and corresponds to the scale on the right. As illustrated in FIG. 7, the vertical etching rate ($ER_b$) of $SiO_2$ decreases with the decrease of the chamber pressure (CP); i.e., the higher the degree of vacuum of the chamber, the higher the vertical etching rate ($ER_b$). As a result, in order to increase the vertical etching rate, plasma etching typically maintains the reactive chamber in a higher degree of vacuum. However, as illustrated in FIG. 7, the etching rate ratio ($ERR_{a/b}$) increases with the increase of the chamber pressure (CP); i.e., the lower the degree of vacuum of the chamber, the closer the etching rate ratio ($ERR_{a/b}$) to 1. As a result, in order to have a better isotropic etching effect, the reactive chamber needs to be maintained at a lower degree of vacuum to increase the etching rate ratio ($ERR_{a/b}$). According to one embodiment, in order to maintain the etching rate ratio ($ERR_{a/b}$) to be within 0.5~1, the chamber pressure (CP) is set to be between 0.25~0.7 Torr. Therefore, in one embodiment, a manually controlled valve is added to an inlet of a gas pump to lower the gas pumping ability of the pump, so that a balance between the gas pumped and the gas admitted can be achieved at a lower degree of vacuum.

The time required to conduct the step of isotropic chemical plasma etching is determined by the thickness of the $SiO_2$ to be etched, and the etching rate. Referring to FIG. 3, according to an embodiment, the multilayer microstructure 330 is fabricated by a TSMC 0.35 μm process. The first metal layer 331a, the second metal layer 331b, the third metal layer 331c and the fourth metal layer 331d are respectively Metal 1, Metal 2, Metal 4 and Metal 4 interconnects, with the height respectively being 6650 Å, 6450 Å, 6450 Å and 9250 Å. The height of the metal via layer and the dielectric layer interposed between each pair of metal layers 331a and 331b, 331b and 331c, or 331c and 331d are 1 μm, and the thickness of the field oxide layer 312 is 2970 Å. According to the above description, the percentage of $O_2$ in $CF_4$ is set to be about 20%, and with both the etching rate ratio ($ERR_{a/b}$) and the vertical etching rate ($ER_b$) taken into consideration, the chamber pressure (CP) is set to be about 0.47 Torr. At such chamber pressure (CP), the vertical etching rate ($ER_b$) is about 38 nm/min, and the lateral etching rate ($ER_a$) is about 30 nm/min as shown in FIG. 7. In the step of isotropic chemical plasma etching, the insulating layer filling the etching through holes 332 is first removed. The total thickness to be removed is about 3577 mm, the required etching time is about 100 min, and the result is illustrated in FIG. 3b. The step of isotropic chemical plasma etching then proceeds removing completely the dielectric layer 311a and the field oxide layer 311b under the first metal layer 331a through lateral etching, and the required etching time for which is determined by the width of the metal layer 331 between etching through holes 332, and is about 50 min.; meanwhile, the substrate 310 made of silicon is etched at an etching rate about 350 nm/min. Finally, a suspended multilayer microstructure 330' is formed as illustrated in FIG. 3c.

Figure 8:
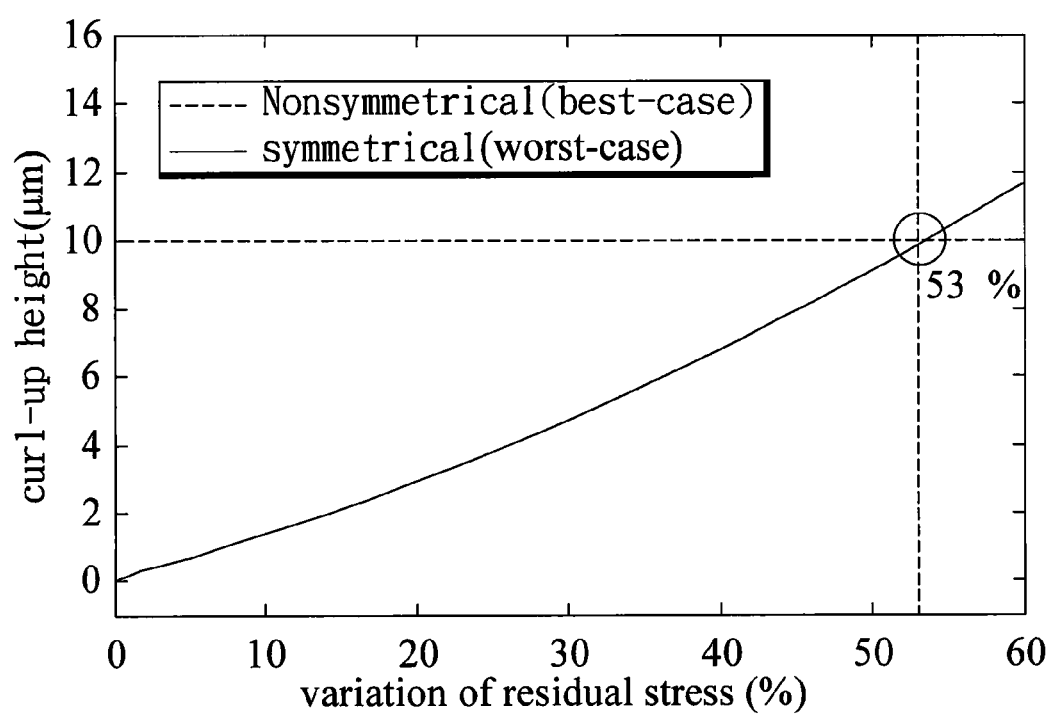
FIG. 8 is a diagram illustrating the relation between the variation of the residual stress of the symmetrical multilayer microstructure and the curl-up height.

FIG. 8 is a diagram illustrating the relation between the variation of the residual stress of the symmetrical multilayer microstructure and the curl-up height. The best-case scenario of nonsymmetrical multilayer microstructure fabricated by the prior method and the worst-case scenario of the symmetrical multilayer microstructure fabricated by the method of the present invention are compared. The best-case scenario refers to that the residual stress between each layer of different material does not vary with the CMOS and the-post CMOS process parameters. On the other hand, the worst-case scenario refers to that the residual stress between each layer of different material varied with the CMOS or the post-CMOS process parameters. As a result, the residual stress is increased with the increase of the number of layers stacked. As illustrated by the dotted line in FIG. 8, for a 500 μm×500 μm plane, the curl-up height under the best-case scenario of an nonsymmetrical structure is about 10 μm, but the curl-up height under the worst-case scenario of a symmetrical structure remains to be lower than such curl-up height of the nonsymmetrical structure until the variation of residual stress is increased up to 53%. From the comparison, the symmetrical multilayer microstructure fabricated using the method of the present invention is capable of balancing the residual stress; thereby effectively improves the curl-up problem.

In conclusion, the present invention provides a method for fabricating a multilayer microstructure with balancing residual stress capability which includes the following steps. First, forming a multilayer microstructure on a substrate. The multilayer microstructure includes a plurality of metal layers separated by an insulating layer, and stacked on the substrate through the insulating layer. The metal layers are symmetrically patterned so as to form a plurality of etching through holes, and the etching through holes are surrounded by metal via layers disposed between the metal layers. Next, a step of isotropic chemical plasma etching is conducted to remove the insulating layer in the etching through holes and the insulating layer between the substrate and the bottom-most metal layer. Since the insulating layer between the substrate and the bottom-most metal layer is removed, the suspended multilayer microstructure is a structure symmetrical in the vertical direction, so that it is capable of improving the curl-up problem by balancing the residual stress.

The embodiments described above are to demonstrate the technical contents and characteristics of the preset invention to enable the persons skilled in the art to understand, make, and use the present invention. However, it is not intended to limit the scope of the present invention. Therefore, any equivalent modification or variation according to the spirit of the present invention is to be also included within the scope of the present invention.

What is claimed is:

1. A method for fabricating a multilayer microstructure with balancing residual stress capability comprising:
   forming a multilayer microstructure on a substrate, wherein the material of the substrate comprises silicon and the multilayer structure comprises:
   a first metal layer;
   a metal via layer disposed on the first metal layer;
   a second metal layer disposed on the metal via layer, wherein the first metal layer and the second metal layer are patterned and aligned symmetrically to form a plurality of etching through holes; and the metal via layer surrounds each of the etching through holes; and
   an insulating layer filling the etching through holes and the remaining space between the first metal layer and the second layer, and disposed on the substrate for the first metal layer to stack thereon; and
   conducting a step of isotropic chemical plasma etching to remove the insulating layer in the etching through holes, the insulating layer between the first metal layer and the substrate, and a portion of the substrate and form a suspended multilayer microstructure on the substrate, wherein in the step of isotropic chemical plasma etching, a chamber pressure larger than vacuum is used, and a ratio between a lateral etching rate and a vertical etching rate under the chamber pressure is between 0.5 to 1; and the reaction gases comprise a gaseous fluoride and oxygen.

2. The method for fabricating a multilayer microstructure with balancing residual stress capability according to claim 1, wherein the step of forming the multilayer microstructure is carried out by a complementary metal oxide semiconductor (CMOS) fabrication process.

3. The method for fabricating a multilayer microstructure with balancing residual stress capability according to claim 1, wherein the material of the insulating layer comprises silicon dioxide.

4. The method for fabricating a multilayer microstructure with balancing residual stress capability according to claim 3, the gaseous fluoride is tetrafluoromethane ($CF_4$).

5. The method for fabricating a multilayer microstructure with balancing residual stress capability according to claim 4, wherein the gas ratio between oxygen and the gaseous fluoride is 10%~40%.

6. The method for fabricating a multilayer microstructure with balancing residual stress capability according to claim 5, wherein the chamber pressure is between 0.25~0.7 Torr.

7. The method for fabricating a multilayer microstructure with balancing residual stress capability according to claim 6, wherein the gas ratio between oxygen and the gaseous fluoride is about 23%.

8. The method for fabricating a multilayer microstructure with balancing residual stress capability according to claim 7, wherein the chamber pressure is about 0.47 Torr.

* * * * *